United States Patent [19]

Krauss

[11] Patent Number: 5,189,704
[45] Date of Patent: Feb. 23, 1993

[54] HEARING AID CIRCUIT HAVING AN OUTPUT STAGE WITH A LIMITING MEANS

[75] Inventor: Gerhard Krauss, Nuermberg, Fed. Rep. of Germany

[73] Assignee: Siemens Aktiengesellschaft, Munich, Fed. Rep. of Germany

[21] Appl. No.: 729,569

[22] Filed: Jul. 15, 1991

[30] Foreign Application Priority Data

Jul. 25, 1990 [EP] European Pat. Off. ......... 90114273.7

[51] Int. Cl.$^5$ .................................................. H04R 25/00
[52] U.S. Cl. .................................. 381/68.4; 381/68.2; 381/104; 381/109
[58] Field of Search ................. 381/68.4, 68.2, 68, 381/101, 105, 104, 109, 74, 72

[56] References Cited

U.S. PATENT DOCUMENTS

| | | | |
|---|---|---|---|
| 3,867,576 | 2/1975 | Simonsen | 381/111 |
| 4,119,814 | 10/1978 | Harless | 381/68.2 |
| 4,517,415 | 5/1985 | Laurence | 381/68.4 |
| 4,543,453 | 9/1985 | Brander | 381/68.4 |
| 5,025,214 | 9/1991 | Lee | 381/105 |

FOREIGN PATENT DOCUMENTS

| | | |
|---|---|---|
| 0237203 | 9/1987 | European Pat. Off. . |
| 2527925 | 12/1983 | France . |
| 0096807 | 5/1986 | Japan .................................. 381/104 |
| WO89/08353 | 9/1989 | PCT Int'l Appl. . |
| 2166015A | 4/1986 | United Kingdom . |

*Primary Examiner*—Jin F. Ng
*Assistant Examiner*—Huyen D. Le
*Attorney, Agent, or Firm*—Hill, Steadman & Simpson

[57] ABSTRACT

A hearing aid circuit has an output stage which is connectable via an earphone and a battery to a circuit that has an adjustable limiting means for electrically limiting the maximum acoustic output level of the hearing aid. The limiting means is electronically designed such that a reduction in the maximally obtainable acoustic output level of the earphone in the zero position of the limitation is avoided. At least one first controllable semiconductor is operated with an adjustable component part as a current-traversed switch given a deactivated electronic limiting, and which can be operated as a current-traversed, variable resistor in the circuit given activated electronic limiting.

15 Claims, 3 Drawing Sheets

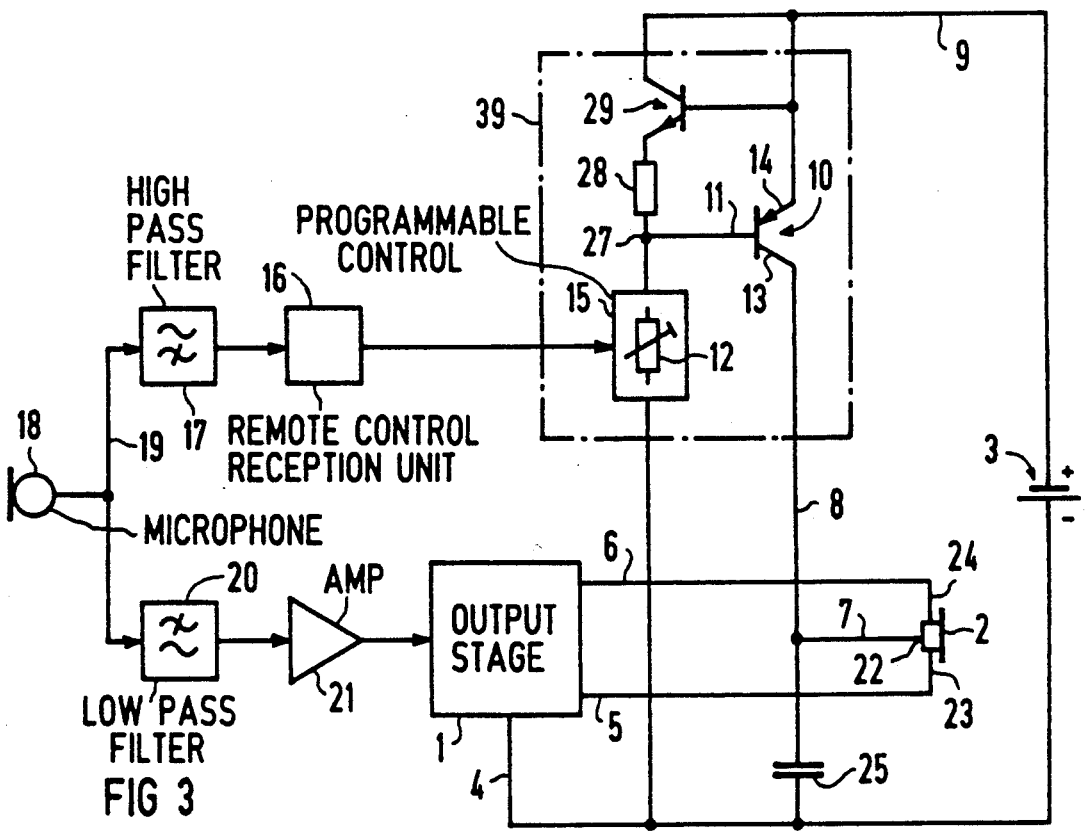
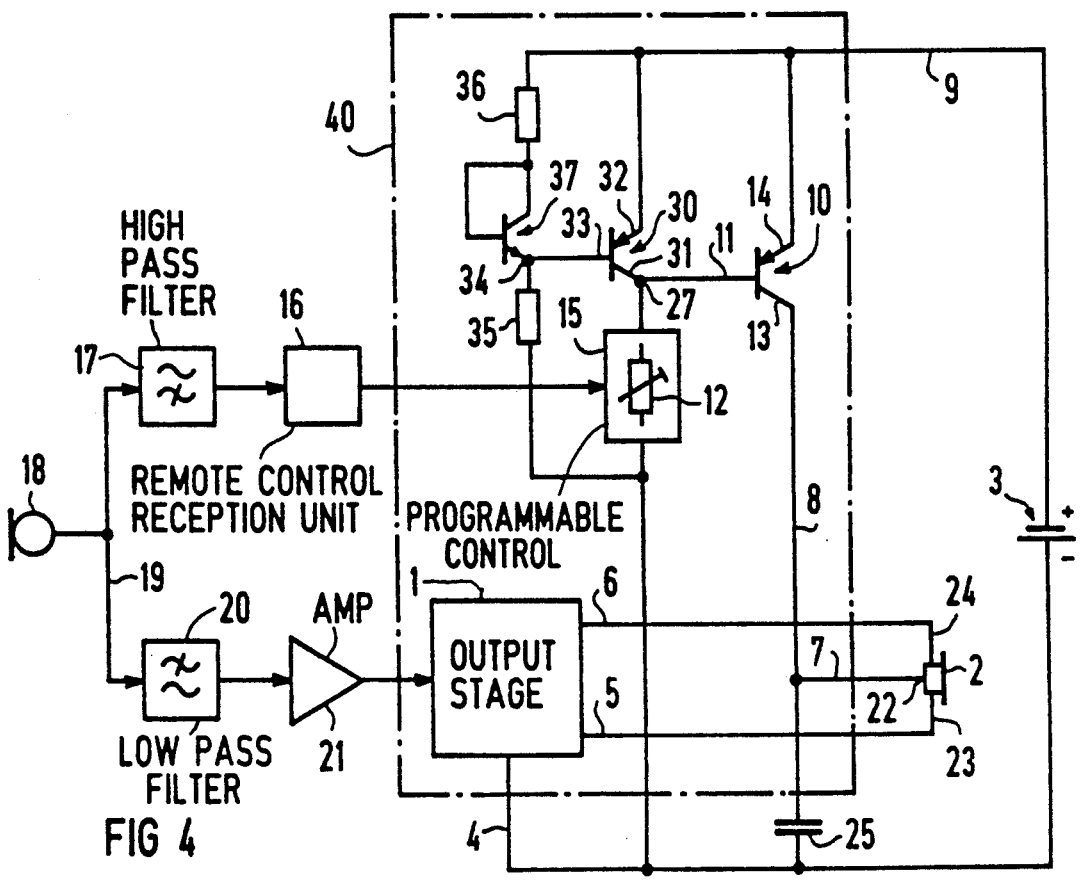

HEARING AID CIRCUIT HAVING AN OUTPUT STAGE WITH A LIMITING MEANS

BACKGROUND OF THE INVENTION

The invention is directed to a hearing aid circuit having an output stage which is connectable via an earphone and a battery to a circuit that comprises a variable limiting means for limiting (clipping) the maximum, acoustic output level of the earphone In known hearing aid circuits of the type initially cited, the electronic limiting means—also referred to as "Peak Clipping=PC"—is designed as a mechanical control. The control acts as a variable, two-pole resistor in the circuit of the output stage between the battery and the earphone.

Programmable, electronic control resistors are also known. The control is usually formed with unipolar transistors (FET) By contrast to a mechanical control, the electronic control cannot be set to a value of resistance of or approximately equal to zero ohms. Consequently, a voltage drop would arise at the programmable electronic control given employment as a PC control even when the limiter is switched off (corresponds to the lowest resistance of the control). Since first the power requirement of the output stage is greatest in this setting, and second the operating voltage at hearing aid circuits for, in particular, hearing aids worn on the head usually amounts to only approximately 1.3 V, the voltage drop which increases linearly with increasing current would lead to a diminution of the maximally obtainable acoustic output level of the earphone. These conditions would have an especially disadvantageous effect, particularly given employment of programmable electronic controls in power output stages, for example push-pull output stages, because of their increased power consumption.

In order to avoid this disadvantage, electronic limiting in the output stage has been abandoned in hearing aid circuits having a power output stage, and the preceding preselector stage has been equipped with a programmable electronic control as a limiting means. What is disadvantageous, however, is that such a hearing aid circuit either has an increased non-linear distortion factor in the region of linear gain, or the gain is also lowered in an undesirable way given reduction of the maximum output level even by a few dB.

In hearing aid circuits having a mechanical control (potentiometer) as a limiting means, the control must be arranged at an outside wall of the hearing aid because of the needed operability. Relatively long connecting lines thereby usually become necessary. These lines are traversed by the maximum current of the output stage in the zero ohm setting of the control. An electromagnetic field is thus generated that can lead to undesired coupling to a telephone coil present in the hearing aid which, as intended, should respond to electromagnetic fields of a telephone.

SUMMARY OF THE INVENTION

An object of the invention is to avoid the described disadvantages and to specify an electronically acting limiting means for a hearing aid circuit of the type initially cited, whereby the reduction of the maximally obtainable acoustic output level of the earphone remains slight when the limiting is shut off.

According to the hearing aid circuit of the invention, an output stage is connected via an earphone and a battery to an adjustable limiting circuit means for limiting a maximum acoustic output level of the earphone. The limiting means is electronic and has at least one first controllable semiconductor. A controllable component means is provided for operating the semiconductor switch given deactivated electronic limiting, and for operating the semiconductor as a current-traversed, variable resistor given activated electronic limiting.

Only an extremely slight voltage drop in the circuit at most occurs at the inventively provided semiconductor which is operated as a current-traversed switch, so that the reduction of the maximally obtainable acoustic output level of the earphone remains slight. The voltage drop at a semiconductor operated as a switch is fundamentally less than at a semiconductor operated as a resistor. Another critical advantage of the solution of the invention may be seen therein that, by contrast to semiconductors operated as a resistor, the voltage drop at the semiconductor operated as a switch remains essentially constant given increasing current. Further, the first, controllable semiconductor is not only operated as a switch in the invention but is also operated as a current-traversed, variable resistor when the limiting means is switched on. What this combination achieves is the special advantage that the electronic limiting means can be essentially formed of only one semiconductor which acts either as a switch or as a variable resistor in the circuit of the output stage in accordance with the setting of the limiting effect (degree of limitation) that has been undertaken.

In a development of the invention, the first controllable semiconductor comprises a control terminal which is connected to an adjustable component part, for example to a programmable electronic resistor. The advantage, for example, of an electronic setting of the electronic limiting means implementable by remote control thus results.

According to an advantageous version, the first controllable semiconductor that can be inventively operated as a switch can be arranged as a switch in the circuit which bridges the adjustable electronic limiting circuit. The inventive advantages of the semiconductor operated as a switch can be combined with those of an electronically programmable resistor, given what is only an extremely slight components expense, as a result of a parallel circuit formed in this way to form, for example, a programmable electronic resistor, particularly when the limiting means is at least partially designed as a component part of an integrated circuit.

BRIEF DESCRIPTION OF THE DRAWINGS

FIGS. 1 through 5 show block and schematic diagrams for hearing aid circuits of the invention having adjustable electronic limiting means.

DESCRIPTION OF THE PREFERRED EMBODIMENTS

Figure 1:
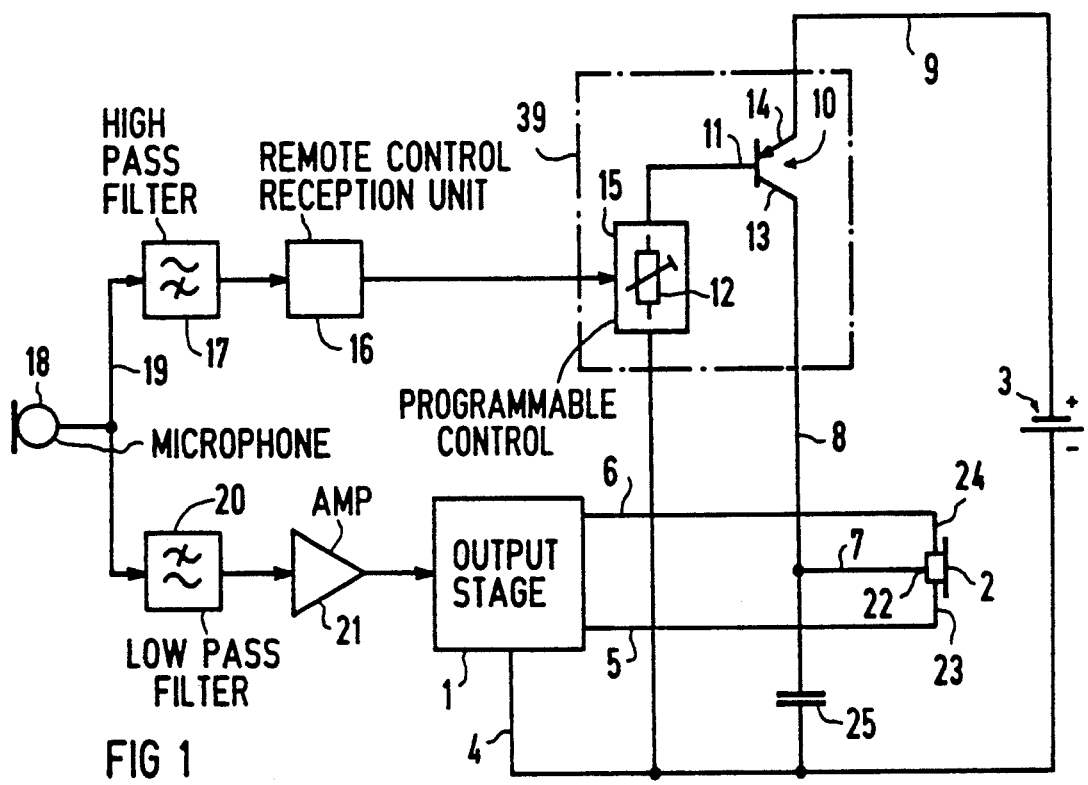

The hearing aid circuit of FIG. 1 comprises an output stage 1 which is connected to a circuit via an earphone 2 with a battery 3. The circuit is closed via lines 4 through 9 and via the transistor 10. The transistor 10 is a first controllable semiconductor—i.e. a controllable (adjustable) electronic component part—and is employed in this hearing aid circuit as an adjustable and electronic limiting means. The effect of the limiting means becomes ineffective, i.e. no limiting occurs, when the transistor 10 is operated as a current-traversed switch in the circuit. This, for example, can occur in that a control terminal 11 (base terminal) is connected to an adjustable component part, for example to a control 12 (potentiometer or the like) which is in turn connected to a pole of the battery—to the negative pole in this exemplary embodiment. For an effect of the limiting means approaching zero, the value of resistance of the control 12 is diminished at least to such an extent that a current which allows the transistor 10 to become transmissive due to overdrive is supplied to the transistor 10 via the control terminal 11. Given adequate overdrive, the transistor 10 is operated as a switch. The transistor 10 is consequently transmissive via its terminals 13 and 14 (collector-emitter path).

After leaving its overdrive range, the transistor 10 is operated as a variable electronic resistor. As a result of a corresponding setting at the control 12, different degrees of limiting by the electronic limiting means designed from the transistor 10 are achieved. The transistor 10, accordingly, can be placed in the immediate proximity of the component parts of the circuit as an adjustable and electronic limiting means, as a result whereof long lines which generate disturbing electrical fields are avoided. Over and above this, the maximally obtainable acoustic output level of the earphone 2 is practically not diminished at all due to the operating mode of the transistor 10 as a switch, which is inventively possible at the same time.

It is advantageous when the transistor 10 has a high current amplification. As a result thereof, the maximum current flow through the control 12 can remain especially low. The control 12 can therefore be placed at an outside wall of the hearing aid, even given employment of long lines. Over and above this, the control 12 can even have a relatively high value of resistance even when the limiting is shut off. A programmable electronic control 15 can thus be employed without problems, instead of the control 12. For example, the control 15 can be programmed via a remote control reception unit 16 which receives remote control signals, for example pulse duration modulated ultrasound signals, via a high-pass filter 17 and a microphone 18 for interpretation and editing. The microphone 18 can simultaneously pick up voice signals and ambient noises which are supplied via a signal branching 19 to a low-pass filter 20 and to a following amplifier 21 which is connected to the output stage 1, for example via a volume control (not shown).

In the hearing aid circuit of FIG. 1, the output stage is designed as a push-pull output stage, and the earphone 2 is designed as a push-pull earphone. This push-pull earphone has a center connection 22 and two terminals 23 and 24 connected to the push-pull output stage 1 via the lines 5 and 6. The transistor 10 (first controllable semiconductor of the limiting means) has the first terminal 14 (emitter terminal) connected via the line 9 to the positive pole of the battery 3 and has the second terminal 13 (collector terminal) connected via the lines 7 and 8 to the center connection 22 of the push-pull earphone 2. A capacitor 25 which is connected to the middle connection 22 of the earphone 2 and to the negative pole of the battery 3 serves the purpose of suppressing undesired oscillations.

Figure 2:
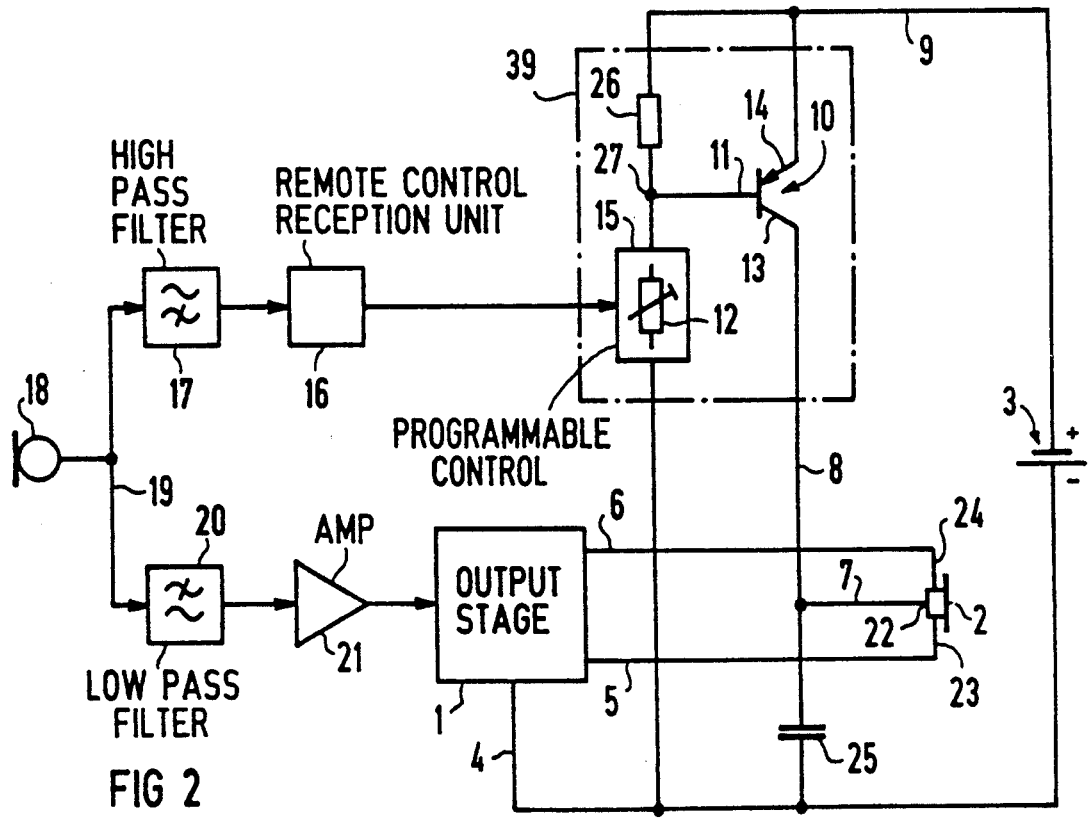

The hearing aid circuit shown in FIG. 2 differs from the hearing aid circuit of FIG. 1 on the basis of a first resistor 26. This first resistor 26 is connected to the adjustable component part, for example to the programmable electronic control 15, to form a first voltage divider which is arranged between the two poles of the battery 3 for dividing the battery voltage. This first voltage divider comprises a voltage tap 27 which is connected to the control terminal (base terminal) of the first controllable semiconductor (transistor 10). Given programmable electronic controls, the range for setting the resistance is often also limited toward higher values of resistance. The range of adjustment of the control 12 or 15 can be adapted with the first resistor 26 to the transistor 10, provided as an adjustable and electronic limiting means.

Deviating from FIG. 2, the first resistor in the first voltage divider in FIG. 3 is formed of a series circuit that comprises the resistor 28 having a fixed value of resistance and a second semiconductor, and a transistor 29 which has a voltage-dependent, non-linear value of resistance. The transistor 29 is a bipolar transistor connected as a diode and doped in complimentary fashion with respect to the first, controllable semiconductor, the transistor 10, as an NPN type. An improvement of the constancy of the maximum acoustic output level of the earphone 2 given decreasing supply voltage can be achieved on the basis of these techniques. The transistor 29 begins to inhibit when the supply voltage drops. The voltage division ratio between the resistor 28 and the control 12 or 15, as well as the base-emitter diode in the transistor 10, thus changes. Accordingly, the base-emitter voltage and thus the base current of the transistor 10 and ultimately the limitation that has been set remain approximately constant.

According to FIG. 4, the first voltage divider is formed of the control 12 or of the programmable electronic control 15 and of a second controllable semiconductor, the transistor 30, which comprises at least three terminals. The transistor 30 is a bipolar transistor and is doped as a PNP type. Its collector-emitter path is connected parallel to the base-emitter path of the transistor 10 via the two terminals 31 and 32 in accordance with the first resistor 26 in FIG. 2. The transistor 30 comprises a control terminal 33 (base terminal) which has a voltage tap 34 connected to a second voltage divider. The second voltage divider is formed of a series circuit of two resistors 35 and 36 having a fixed value of resistance and of a third semiconductor, a transistor 37. The transistor 37 has a voltage-dependent, non-linear value of resistance, is connected as a diode, is executed as a bipolar transistor, is doped as an NPN type, and is thus doped in complementary fashion vis-a-vis the first controllable semiconductor 10 and the second controllable semiconductor 30 in FIG. 4. The hearing aid circuit arrangement of FIG. 4 allows both earphones having low impedance as well as having high impedance to be adapted to a variable electronic limiting circuit. When a programmable electronic switch is selected as a control—a limited number of values of resistance being programmable therewith in association with the type—, such an electronic switch, over and above this, can likewise adapt both to the electronic limiting means as well as to the respective earphone impedance with the hearing aid circuit shown in FIG. 4.

Figure 5:
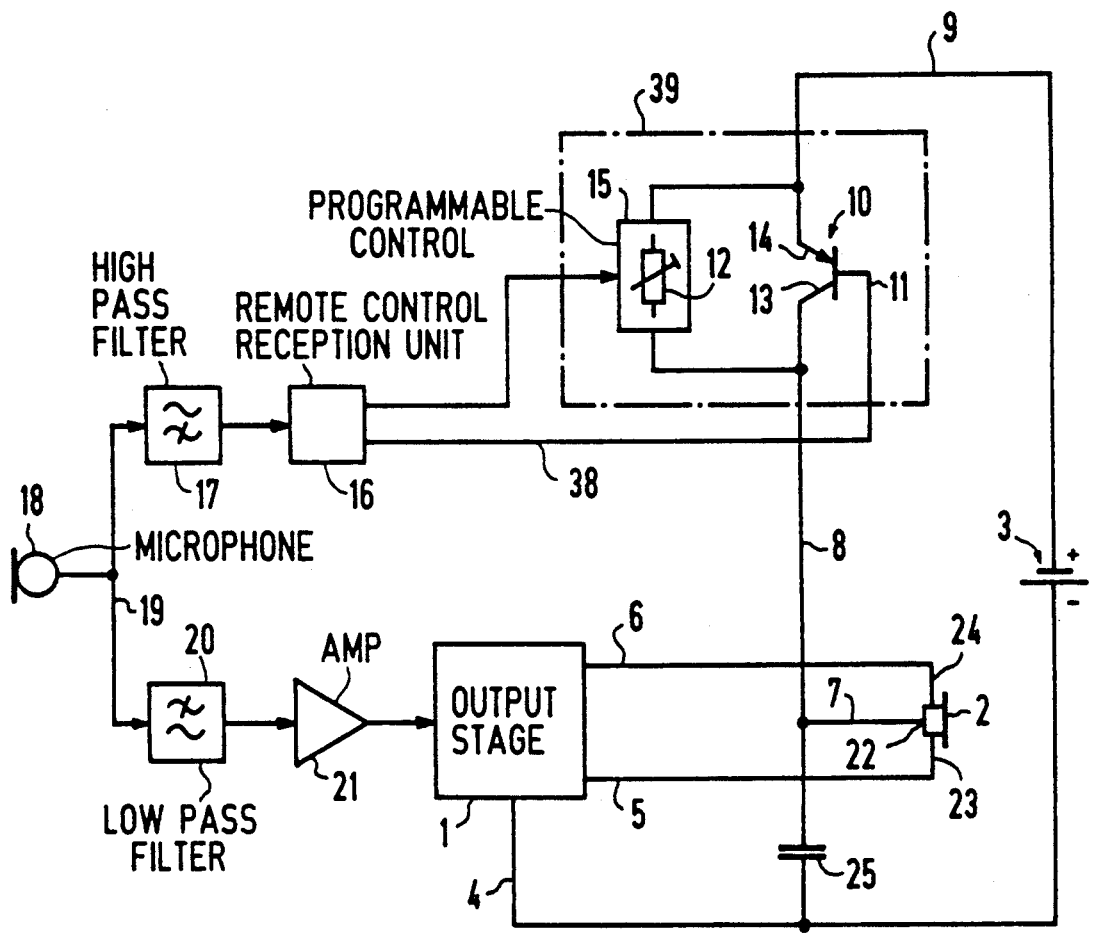

In FIG. 5, the hearing aid circuit comprises a variable electronic limiting means wherein the first controllable semiconductor, the transistor 10, is arranged in the circuit as a switch which bridges the variable limiting circuit. The variable limiting circuit comprises the control 15 as a programmable electronic resistor, this being programmable via a remote control such as is presented, for example, in the description of FIG. 1. The remote control reception part 16 additionally switches the transistor 10 via a line 38 and via the control terminal 11 for setting an inactive limitation into the conductive region (switch operation), as a result whereof the current in the circuit of the output stage 1 no longer flows via the electronic control 15. When a limitation has been set, the transistor 10 is inhibited (blocking mode), this being effected by a corresponding switch signal, for example freedom from voltage on the line 38, from the remote control reception part 16.

The electronic limiting means can be completely or partially designed as a component part of an integrated circuit, as symbolically indicated by a dot-dash limiting line 39 in FIG. 5 and in FIGS. 1 through 3. Over and above this, the limiting means can also be entirely or partially designed as a common integrated circuit together with the output stage I, as has been symbolically shown by a dot-dash limiting line 40 in FIG. 4.

The electronic limiting means as shown, for example, in FIG. 1 can also be controlled (set) via a power or voltage source that, for example, can be programmable via a remote control. For this purpose, the adjustable component part that is connected to the control terminal 11 of the transistor 10 is designed as a current or voltage source. Such a designing of the limiting means can be favorably realized in combination with an integrated circuit (IC).

The arrangement of the electronic limiting means can occur at a different place in the circuit of the output stage 1 of the hearing aid circuit of the invention. For example, it is thus possible to arrange a respective electronic limiting means in each line 5 and 6 of FIG. 1.

At least one semiconductor of the electronic limiting means can also be designed as a unipolar transistor—field effect transistor.

Although various minor changes and modifications might be proposed by those skilled in the art, it will be understood that I wish to include within the claims of the patent warranted hereon all such changes and modifications as reasonably come within my contribution to the art.

I claim as my invention:

1. A hearing aid circuit, comprising:
   an output stage connected via an earphone and a battery to an adjustable limiting circuit means for limiting a maximum acoustic output level of the earphone;
   said limiting means being electronic and comprising at least one first controllable semiconductor;
   controllable component means comprising a programmable electronic resistor for operating the semiconductor as a current-traversed switch given deactivated electronic limiting, and for operating the semiconductor as a current-traversed, variable resistor given activated electronic limiting;
   the first controllable semiconductor comprising a control terminal which is connected to the controllable component means; and
   for electronic limiting approaching zero, the first controllable semiconductor being supplied via the controllable component means with a current which allows the first controllable semiconductor to become transmissive due to overdrive.

2. A hearing aid circuit according to claim 1 wherein the output stage is designed as a push-pull earphone that has a and the earphone is designed as a push-pull earphone that has a middle connection and two terminals connected to the push-pull output stage, and the first controllable semiconductor of the limiting means has a first terminal connected to the battery and a second terminal connected to the middle connection of the push-pull earphone.

3. A hearing aid circuit according to claim 1 wherein the controllable component means and at least a first resistor are connected to form a first voltage divider means having a voltage tap which is electrically connected to the control terminal of the first controllable semiconductor and at which a voltage of the battery is divided.

4. A hearing aid circuit according to claim 3 wherein the first resistor of the first voltage divider means is formed of a series circuit of a resistor having a fixed value of resistance and of a second semiconductor that has a voltage-dependent non-linear value of resistance.

5. A hearing aid circuit according to claim 4 wherein the second semiconductor is a transistor connected as a diode.

6. A hearing aid circuit according to claim 1 wherein the first controllable semiconductor is arranged as a switch which bridges the controllable electronic limiting means.

7. A hearing aid circuit according to claim 1 wherein the controllable limiting means comprises a programmable electronic resistor which is programmable via a remote control.

8. A hearing aid circuit according to claim 1 wherein the controllable limiting means comprises a programmable electronic resistor which is programmable via a programming means.

9. A hearing aid circuit according to claim 1 wherein a bipolar transistor is selected at least for the first semiconductor of the limiting means.

10. A hearing aid circuit according to claim 1 wherein the limiting means is at least partially designed as a component part of an integrated circuit.

11. A hearing aid circuit according to claim 1 wherein the limiting means is at least partially designed as a common integrated circuit together with the output stage.

12. A hearing aid circuit, comprising:
    an output stage connected via an earphone and a battery to an adjustable limiting circuit means for limiting a maximum acoustic output level of the earphone;
    said limiting means being electronic and comprising at least one first controllable semiconductor;
    controllable component means for operating the semiconductor as a current-traversed switch given deactivated electronic limiting, and for operating the semiconductor as a current-traversed, variable resistor given activated electronic limiting;
    the first controllable semiconductor comprising a control terminal which is connected to the controllable component means;
    the controllable component means and at least a first resistor being connected to form a first voltage divider means having a voltage tap which is electrically connected to the control terminal of the first controllable semiconductor and at which a voltage of the battery is divided; and
    the first resistor of the first voltage divider means comprising a second controllable semiconductor having at least three terminals whose control terminal is connected to a voltage tap at a second voltage divider which is formed of a series circuit of two resistors having a fixed value of resistance and of a third semiconductor which has a voltage-dependent non-linear value of resistance.

13. A hearing aid circuit according to claim 12 wherein the third semiconductor is a transistor connected as a diode.

14. A hearing aid circuit comprising:
an output stage connected to drive an earphone;
an adjustable limiting circuit means connected to control and limit a maximum acoustic output level of the earphone;
said limiting means comprising at least one controllable semiconductor;
circuit means for operating the semiconductor as a switch when deactivated electronic limiting is not desired, and for operating the semiconductor as a variable resistor when electronic limiting is desired;
said circuit means comprising a programmable electronic resistor connected to control an input of said controllable semiconductor; and
remote control means for adjusting the programmable electronic resistor by high frequency signals transmitted from a remote location external to the hearing aid circuit.

15. A hearing aid circuit according to claim 14 wherein high pass filter means is provided for deriving said high frequency signals for control of said remote control means and wherein a low pass filter means is provided for providing output signals which are relatively lower and are signals employed for aiding hearing of a user, and wherein both the high pass filter means and the low pass filter means have inputs connected in common to a microphone.

* * * * *